United States Patent
Kim

(10) Patent No.: US 6,596,649 B2
(45) Date of Patent: Jul. 22, 2003

(54) METHOD AND APPARATUS FOR SUPPLYING GAS USED IN SEMICONDUCTOR PROCESSING

(75) Inventor: Jeong-Ju Kim, Osan-si (KR)

(73) Assignee: Samsung Electronics Co., Ltd., Suwon (JP)

( * ) Notice: Subject to any disclaimer, the term of this patent is extended or adjusted under 35 U.S.C. 154(b) by 0 days.

(21) Appl. No.: 10/301,655

(22) Filed: Nov. 22, 2002

(65) Prior Publication Data

US 2003/0075527 A1 Apr. 24, 2003

Related U.S. Application Data

(62) Division of application No. 10/059,209, filed on Jan. 31, 2002, now Pat. No. 6,506,255.

(30) Foreign Application Priority Data

Feb. 6, 2001 (KR) .......................................... 2001-5624

(51) Int. Cl.[7] ....................... H01L 21/31; H01L 21/469; H01L 21/302
(52) U.S. Cl. ....................... 438/758; 438/680; 438/689; 427/248.1
(58) Field of Search ................................. 438/758, 680, 438/681, 689; 427/248.1, 569, 585

(56) References Cited

U.S. PATENT DOCUMENTS

| | | | |
|---|---|---|---|
| 4,792,378 A | * 12/1988 | Rose et al. ................. | 156/643 |
| 5,091,217 A | * 2/1992 | Hey et al. ................. | 427/248.1 |
| 5,140,939 A | 8/1992 | Valentian | |
| 5,336,324 A | 8/1994 | Stall et al. | |
| 5,595,602 A | * 1/1997 | Harlan ........................ | 118/715 |
| 5,882,414 A | * 3/1999 | Fong et al. ............. | 118/723 R |
| 5,908,662 A | 6/1999 | Fu | |
| 6,312,518 B1 | 11/2001 | Kwon | |
| 6,506,255 B2 | * 1/2003 | Kim ........................... | 118/715 |

FOREIGN PATENT DOCUMENTS

| | | |
|---|---|---|
| JP | 2-71511 | 3/1990 |
| JP | 2000-58294 | 2/2000 |
| KR | 1998-082853 | 12/1998 |

* cited by examiner

*Primary Examiner*—Alexander Ghyka
(74) *Attorney, Agent, or Firm*—Volentine Francos, PLLC

(57) ABSTRACT

A method and apparatus for uniformly supplying a gas into a chamber through a dispersion head. The gas is introduced through an inlet of the dispersion head, and flows in a flow direction toward a first diffuser arranged in the dispersion head. The gas is diffused a first time within the dispersion head by dispersing the gas along side directions different than the flow direction by contacting the gas and the first diffuser. A portion of the first diffused gas is guided through an outlet of the dispersion head and toward a work piece arranged in a chamber. A remaining portion of the first diffused gas is diffused a second time by contacting the gas and a second diffuser disposed between the first diffuser and the work piece, by dispersing the gas along side directions different than the flow direction. A portion of the twice diffused gas is guided through the outlet of the dispersion head and toward the work piece arranged in the chamber.

6 Claims, 9 Drawing Sheets

METHOD AND APPARATUS FOR SUPPLYING GAS USED IN SEMICONDUCTOR PROCESSING

CROSS-REFERENCE TO RELATED APPLICATIONS

This is a divisional of application Ser. No. 10/059,209, filed Jan. 31, 2002, now U.S. Pat. No. 6,506,255 which is incorporated herein by reference in its entirety.

BACKGROUND OF THE INVENTION

1. Field of the Invention

The present invention relates to a method and apparatus for supplying a gas used in semiconductor processing, and more particularly, to a method and apparatus for supplying a gas into a chamber using a dispersion head.

2. Description of the Related Art

The elements of a semiconductor device are becoming more densely integrated to improve the processing speed and increase the storage capacity. However, with increases in processing speed, storage capacity, and integration density, the manufacturing techniques to produce the devices must keep pace and become increasingly sophisticated to ensure the production of proper functioning and reliable devices.

Areas of particular focus to ensure reliability and integrity during the processing sequence are chemical vapor deposition techniques for the formation. of thin films, and plasma etching techniques for the forming patterns in the thin films.

As the design rule for newer semiconductor devices advances towards 0.15 $\mu$m or less, it is imperative that the thin films and patterns formed on the substrate have uniform thicknesses. To ensure uniformity in the resulting films and patterns, the supply of gas used to form the films and patterns should be uniform, and thus should be continually checked and controlled.

Accordingly, the equipment used for forming a film or a pattern include an apparatus to supply the gas uniformly, such as a dispersion head and a diffuser, which is disposed in the dispersion head.

These types of equipment are disclosed in Japanese Patent Laid-Open Publication No. Hei 2-71511, Japanese Patent Laid-Open Publication No. 2000-58294, U.S. Pat. No. 5,595,602 (issued to Harlan et al.), and Korean Patent Laid-Open Publication No. 1998-82853, described later.

FIG. 1 is a simplified schematic view of a processing apparatus used in a conventional semiconductor process. Referring to FIG. 1, this processing apparatus corresponds to either a film forming apparatus for forming a film on a substrate (W), or an etching apparatus for etching a film formed on a substrate to form a pattern. The selection of whether the apparatus is a film forming apparatus or an etching apparatus is determined by the process condition.

The processing apparatus has a chamber 10, and includes therein a pedestal 101 on which the substrate (W) is mounted at a lower portion of the chamber 10, a dispersion head 103 positioned at an upper portion of the chamber 10 and confronting the substrate (W), and a diffuser 105 disposed within the dispersion head 103. The dispersion head 103 has an inlet at one side thereof, into which a source gas is introduced, and an outlet at the other side thereof through which the source gas is discharged. Thus, the gas is introduced through the inlet of the dispersion head 103 and is diffused by the diffuser 105 to be supplied, through the outlet of the dispersion head 103, onto the substrate (W) placed in the chamber 10.

FIG. 2 is a perspective view of the plate-shaped diffuser 105 disposed within the dispersion head 103 of FIG. 1. The diffuser 105 is disposed within the dispersion head 103 to block and deflect the source gas that is supplied through the dispersion head 103, thereby diffusing the gas. As a result, this diffused gas has a uniform distribution as it is supplied onto the substrate (W) placed in the chamber 10.

In addition to the aforementioned plate shape, the diffuser 105 may have various other suitable shapes, so long as the gas is diffused and supplied uniformly to the substrate (W).

For example, U.S. Pat. No. 5,595,602 discloses a porous sintered diffuser to uniformly supply a gas onto the whole surface of a substrate. Korean Patent Laid-Open Publication No. 1998-82853 discloses a diffuser having a through hole formed around its central portion to uniformly supply a gas onto the whole surface of a substrate. Japanese Patent Laid-Open Publication No. 2000-58294 discloses two diffusers each having the same diameter. The two diffusers have different shaped holes that are parallel to each other, to uniformly supply a gas onto the whole surface of a substrate.

Furthermore, Japanese Patent Laid-Open Publication No. Hei 2-71511 discloses a dispersion head having holes with different diameters to uniformly supply a gas onto the whole surface of a substrate.

In each of these references, the dispersion head and the diffuser embodiments attempt to ensure the gas is uniformly supplied onto the whole surface of a substrate.

However, for diffusers having a circular shape, it has been found that while the gas is blocked, it is not diffused sufficiently, and as a result, the gas is not uniformly supplied onto the whole surface of a substrate placed in the chamber 10. This is because the gas diffused by the circular diffuser 105 is predominantly diffused around an outer circumferential portion of the dispersion head 103.

FIG. 3 is a sectional view showing a film formed on a substrate using the processing apparatus of FIG. 1. Referring to FIG. 3, a film 32 is formed on a substrate 30. The film 32 may be made of an insulator material or a metal layer, and is selected depending on the process condition. The film 32 is formed by a reaction between process gases as supplied through the dispersion head and diffuser. Ideally, if the process gases are uniformly supplied onto the whole surface of the substrate 30, the film 32 should have a uniform thickness.

However, when forming the film 32 using the apparatus of FIG. 1, a thickness $l_1$ formed at an outer circumferential portion of the substrate 30 is greater than a thickness $l_2$ formed at a central portion of the substrate 30. This is because the process gases are not uniformly supplied onto the whole surface of the substrate 30. More specifically, this is because the outer circumferential portion of the substrate 30 is supplied with larger amounts of the process gas larger relative to the central portion of the substrate 30.

The non-uniformity in the thickness of the film is due to the non-uniformity in the distribution of the process gases supplied, which is a primary cause of failures while fabricating semiconductor devices, thereby decreasing productivity and reliability. This non-uniform distribution of the process gases is apparently due to the structure of the dispersion head and the diffuser.

SUMMARY OF THE INVENTION

Accordingly, it is an object of the present invention to provide a method for supplying and uniformly diffusing a process gas onto the entire region of a work piece such as a wafer, including the central portion and the peripheral portion thereof.

It is another object of the present invention to provide an apparatus for supplying and uniformly diffusing a process gas onto the entire region of a work piece such as a wafer, including the central portion and the peripheral portion thereof.

To achieve the above objects and other advantages, there is provided a method for supplying a gas used in a semiconductor process, including flowing a gas in a flow direction toward a first diffuser arranged in a dispersion head. The gas is diffused a first time within the dispersion head by dispersing the gas along side directions different than the flow direction by contacting the gas and the first diffuser. A portion of the first diffused gas is guided through an outlet of the dispersion head and toward a work piece arranged in a chamber. Then, a remaining portion of the first diffused gas is diffused again by contacting the first diffused gas with a second diffuser disposed between the first diffuser and the work piece, by dispersing the gas along side directions different than the flow direction. A portion of the twice diffused gas is guided through the outlet of the dispersion head and toward the work piece arranged in the chamber.

Additional diffusers could be added within the dispersion head, and in such cases, a remaining portion of the (n−1)-th diffused gas is diffused an n-th time by contacting the gas with an n-th diffuser disposed between the (n−1)-th diffuser and the work piece, by dispersing the gas along side directions different than the flow direction. A portion of the n-th diffused gas is then guided through the outlet of the dispersion head and toward the work piece arranged in the chamber. In this case, n is a natural number greater than 2.

The gas is thus diffused at least twice prior to being supplied into the chamber to ensure it has a uniform distribution as supplied onto the substrate.

According to another aspect of the present invention, there is provided an apparatus for supplying a gas used in a semiconductor process, including a dispersion head having a gas supply inlet and a gas discharge outlet. A first diffuser is arranged in an upper central portion of the dispersion head, and downstream of the gas supply inlet, and a second diffuser is arranged downstream of the first diffuser and disposed radially outward of the first diffuser and toward a peripheral portion of the dispersion head. The first diffuser and second diffuser are spaced apart vertically relative to a flow direction of a gas supplied through the gas supply inlet, and spaced apart radially relative to the central and peripheral portions of the dispersion head.

Additional diffusers can be provided in the dispersion head. If so, then the n-th diffuser is arranged downstream of the (n−1)-th diffuser and disposed radially outward of the (n−1)-th diffuser and toward the peripheral portion of the dispersion head. The (n−1)-th diffuser and n-th diffuser are spaced apart vertically relative to a flow direction of a gas supplied through the gas supply inlet, and spaced apart radially relative to the peripheral portions of the dispersion head. In this case, n is a natural number greater than 2.

Preferably, the first diffuser has a circular plate shape and the second diffuser has an annular plate (or ring) shape. The inner diameter of the second diffuser is greater than an outer diameter of the first diffuser. If a third diffuser is added, the inner diameter of the third diffuser is greater than the outer diameter of the second diffuser, and so on.

Preferably, the chamber is a processing chamber for forming a film using a plasma reaction, or a processing chamber for etching a film formed on the substrate using a plasma reaction. An election of such processing chambers depends on the processing conditions and desired result.

Thus, the gas is uniformly diffused at least twice prior to being supplied into the chamber and thereby it has a uniform distribution as supplied onto the substrate. As a result, it becomes possible to form a film or a pattern having a uniform thickness.

BRIEF DESCRIPTION OF THE DRAWINGS

The above objects and other advantages of the present invention will become more apparent by describing in detail the preferred embodiments thereof with reference to the accompanying drawings, in which.

DETAILED DESCRIPTION OF THE PREFERRED EMBODIMENTS

The present invention now will be described more fully with reference to the accompanying drawings, in which preferred embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
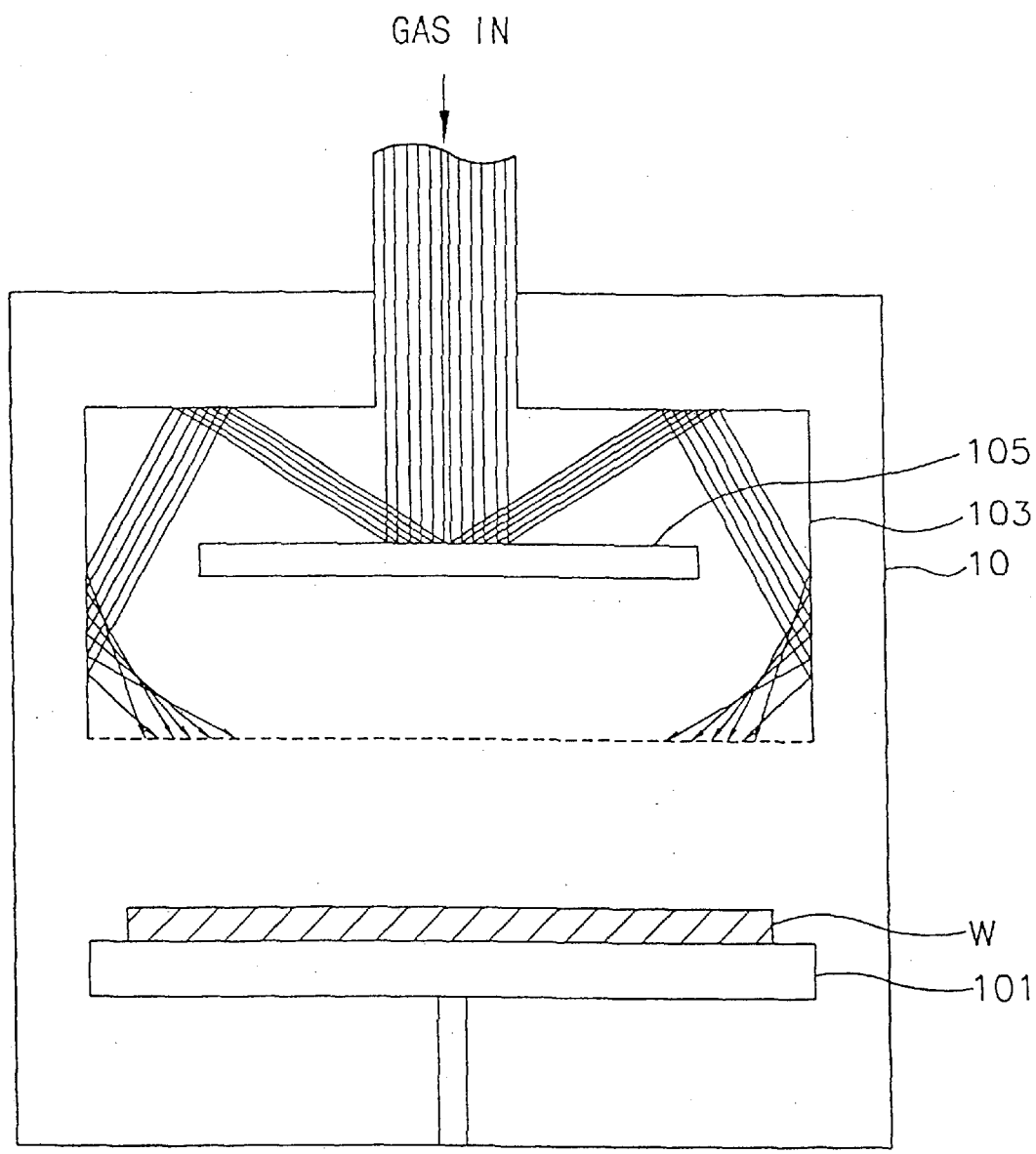
FIG. 1 is a simplified schematic view of a processing apparatus used in a conventional semiconductor process.
Figure 2:
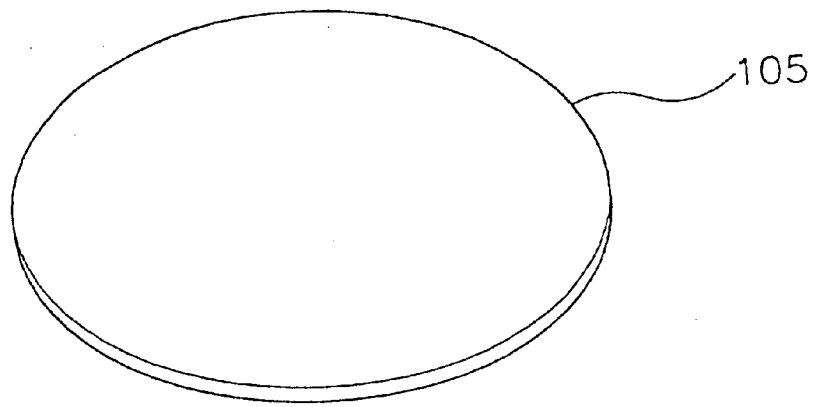
FIG. 2 is a perspective view of a diffuser disposed in the apparatus of FIG. 1.
Figure 3:
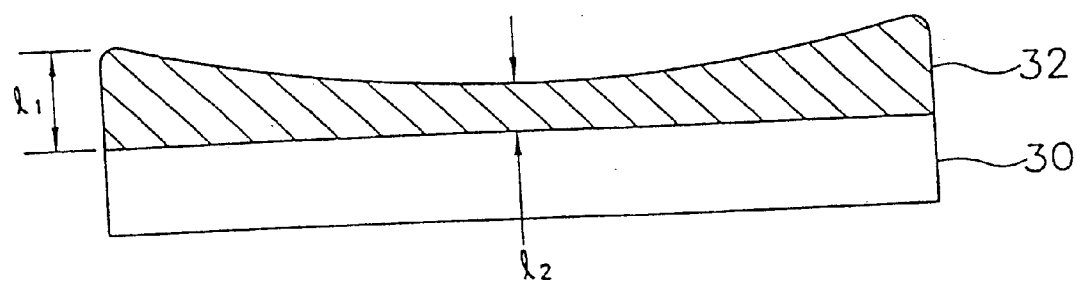
FIG. 3 is a simplified sectional view showing a state of a film formed on a substrate using the equipment of FIG. 1.
Figure 4:
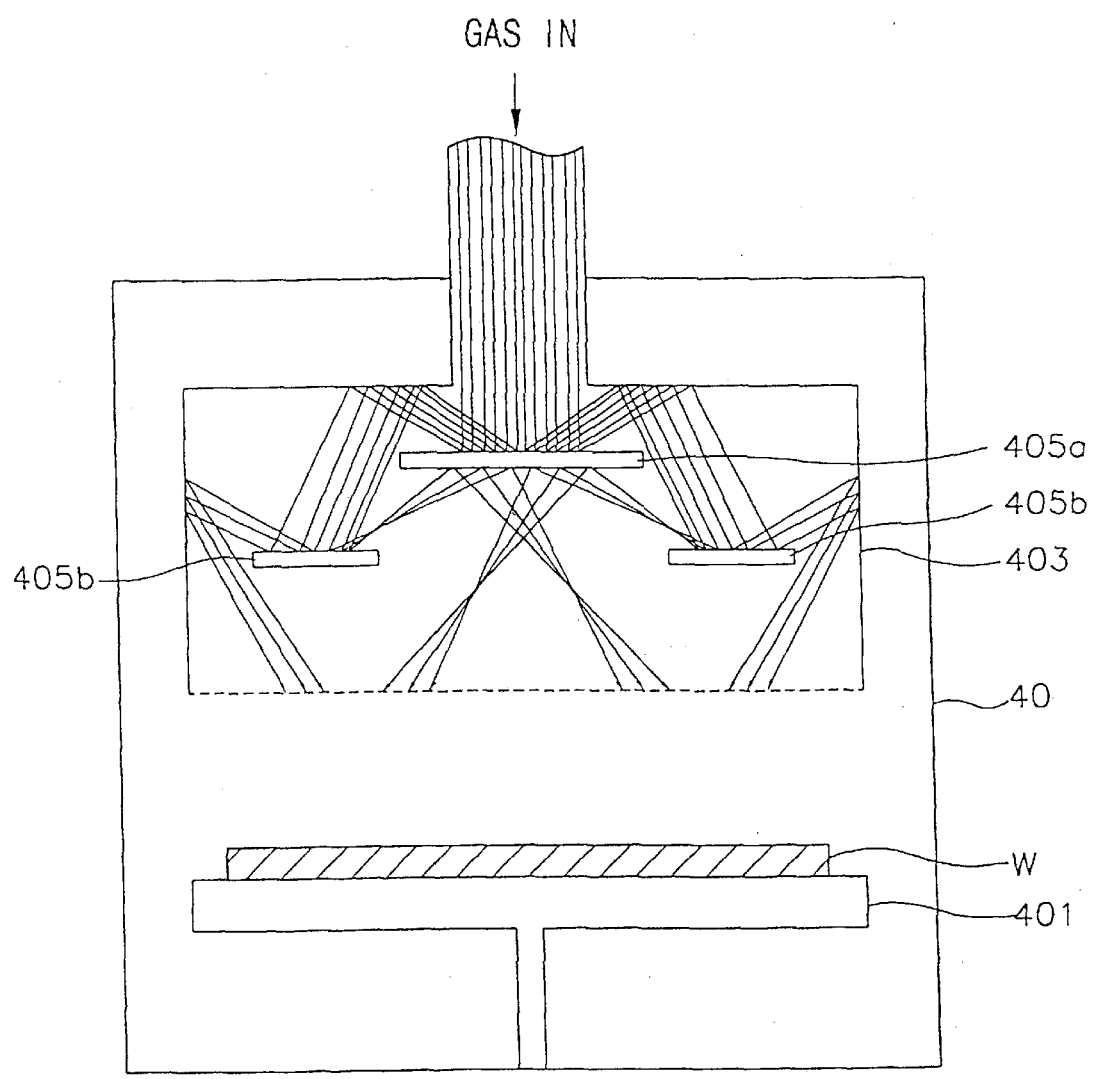
FIG. 4 is a simplified sectional view of a processing apparatus used in a semiconductor process in accordance with a preferred embodiment of the present invention.

FIG. 4 is a simplified schematic view of a processing apparatus used in a semiconductor process in accordance with a preferred embodiment of the present invention. Referring to FIG. 4, the processing apparatus corresponds to either a film forming apparatus for forming a film on a substrate (W), or an etching apparatus for etching a film formed on the substrate (W) to form a pattern. An election of the film forming apparatus or the etching apparatus is determined based on a process condition.

In order to form silicon oxide on a substrate such as a wafer (W), silane ($SiH_4$) gas and oxygen gas are supplied, and a process condition for decomposing and changing the supplied silane gas and the oxygen gas into plasma is employed. Process conditions such as pressure, time, and temperature are selected depending on thickness of silicon oxide to be formed.

Thereafter, when $CHF_3$ gas is supplied into the processing apparatus and a process condition for decomposing the $CHF_3$ gas and converting the $CHF_3$ gas into plasma is employed, the silicon oxide is changed into a silicon oxide pattern. In order to change the silicon oxide into the silicon oxide pattern, a conventional photoresist pattern is used as a pattern mask. Process conditions such as pressure, time, and temperature are selected depending on thickness of the silicon oxide to be etched.

The processing apparatus has a chamber 40, including a pedestal 401 on which the substrate (W) is mounted in a lower portion of the chamber 40, a dispersion head 403 arranged at an upper portion of the chamber 10 and confronting the substrate (W), and first and second diffusers 405a and 405b disposed within the dispersion head 403.

The first diffuser 405a is disposed at an upper portion of the dispersion head 403, as viewed with respect to an inlet direction of a process gas, and the second diffuser 405b is disposed at a lower portion of the dispersion head 403, below the first diffuser 405a. The first diffuser 405a is placed at a central portion of the dispersion head 403 and the second diffuser 405b is placed at a peripheral portion of the dispersion head 403. In other words, as shown in FIG. 4, the first diffuser and second diffuser are spaced apart vertically relative to a flow direction of a gas supplied through the gas supply inlet, and are spaced apart radially relative to the central and peripheral portions of the dispersion head.

Figure 5:
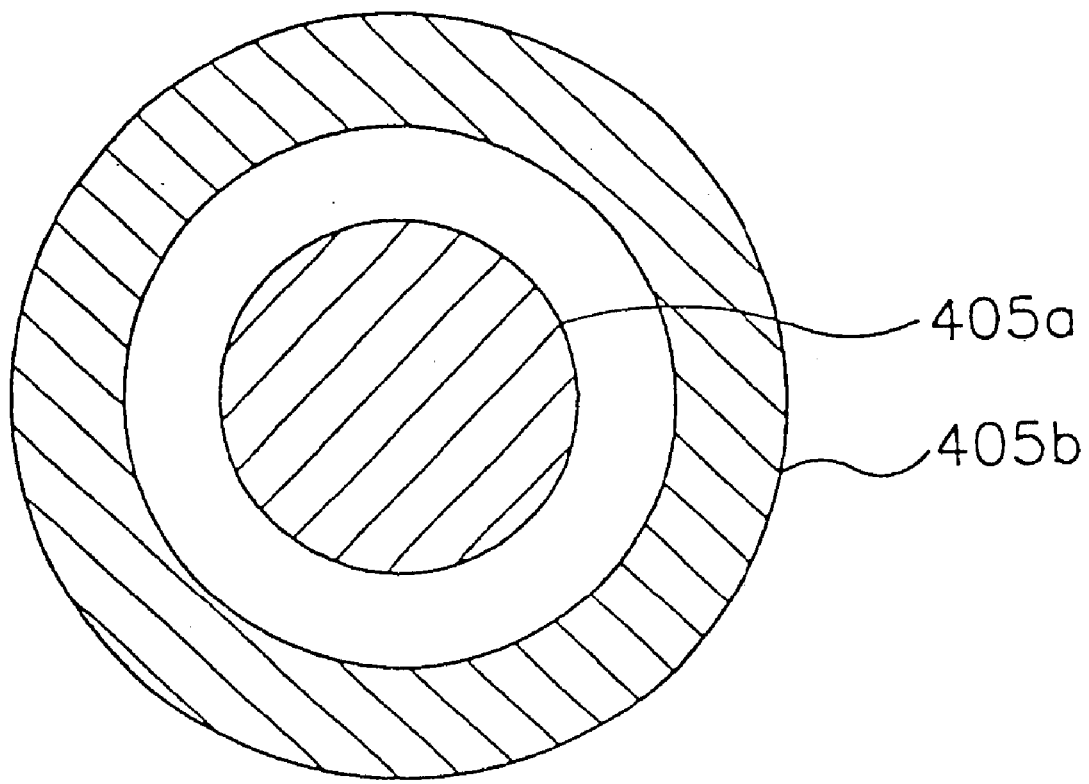
FIG. 5 is a plan view of a first diffuser and a second diffuser disposed in the processing apparatus of FIG. 4.

FIG. 5 is a plan view showing the first and second diffusers 405a and 405b disposed in the dispersion head 403. Referring to FIG. 5, the first diffuser 405a has a circular plate shape and the second diffuser 405b has an annular plate shape, or ring-shaped plate, such that it is spaced apart by a predetermined interval from the outer circumference of the first diffuser 405a and encircles the first diffuser 405a, as viewed from above. In other words, the inner diameter of the second diffuser 405b is greater than the outer diameter of first diffuser 405a.

Figure 6:
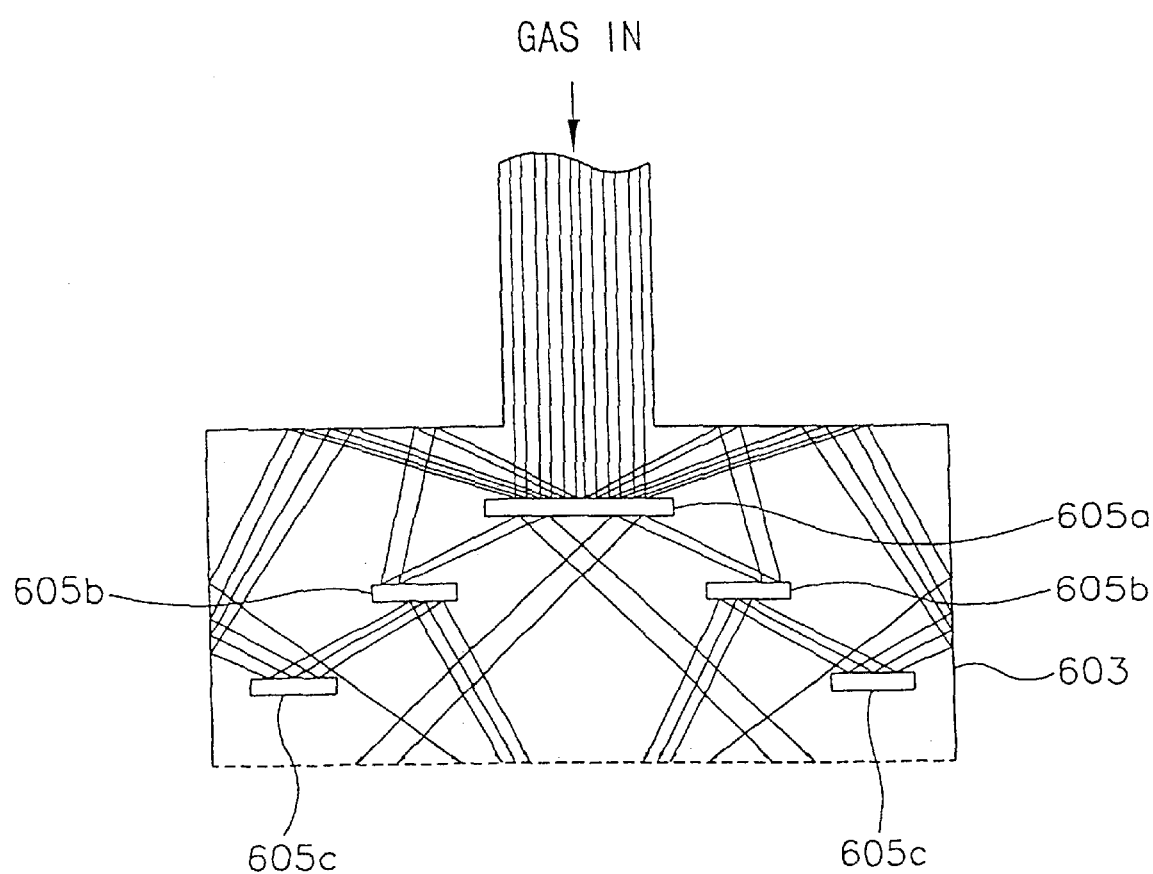
FIG. 6 is a simplified schematic view of processing apparatus used in a semiconductor process in accordance with another preferred embodiment of the present invention.

FIG. 6 is a simplified schematic view of a processing apparatus used in a semiconductor process, in which first, second and third diffusers 605a, 605b and 605c are disposed. Referring to FIG. 6, the first diffuser 605a has a circular plate shape, the second diffuser 605b has an annular plate shape, such that it is spaced apart by a predetermined interval from the outer circumference of the first diffuser 605a and encircles the first diffuser 605a, as viewed from above. In other words, the inner diameter of the second diffuser 605b is greater than the outer diameter of first diffuser 605a. The third diffuser 605c also has an annular plate shape similar to the second diffuser 605b. The third diffuser 605c is spaced apart by a predetermined interval from the outer circumference of the second diffuser 605b and encircles the second diffuser 605b, as viewed from above. In other words, the inner diameter of the third diffuser 605c is greater than the outer diameter of second diffuser 605a.

The first diffuser 605a is disposed at the upper portion of the dispersion head 603 as viewed with respect to an inlet direction of a process gas, the second diffuser 605b is disposed below the first diffuser 605a inside the dispersion head 603, and the third diffuser 605c is disposed below the second diffuser 605b inside the dispersion head 603. The first diffuser 605a occupies the central portion of the dispersion head 603, the second diffuser 605b occupies a peripheral portion of the dispersion head 603 radially outward of the first diffuser 605a, and the third diffuser 605c occupies a peripheral portion of the dispersion head 603 radially outward of the second diffuser 605b. Therefore, as shown in FIG. 6, the first diffuser, second and third diffusers are spaced apart vertically relative to a flow direction of a gas supplied through the gas supply inlet, and are spaced apart radially relative to the central and peripheral portions of the dispersion head.

In the context of the present invention, it is possible to arrange more many diffusers within the dispersion head, for example, a first diffuser to n-th diffuser (n is natural number which is greater than 2) inside the dispersion head 603 in the first through n-th named order. When the first diffuser to n-th diffusers are arranged inside the dispersion head, their diameters are easily selected considering the size of the dispersion head and the diffusing direction of a process gas.

Figure 7:
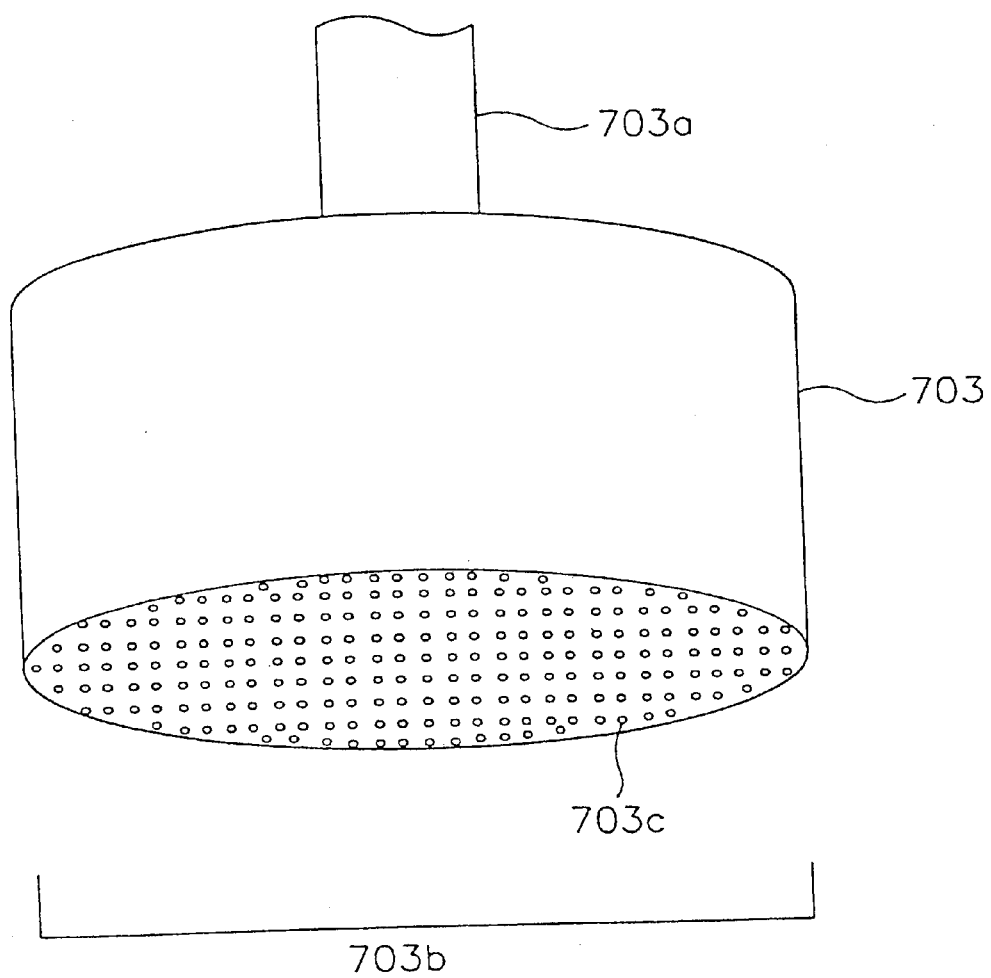
FIG. 7 is a perspective view of a dispersion head disposed in the processing apparatus of FIG. 4.

FIG. 7 is a perspective view of the dispersion head shown in FIG. 4. The dispersion head 703 has an inlet 703a into which a gas is introduced and an outlet 703b through which a gas is discharged. The inlet 703a is connected to a gas supply line (not shown) and is installed at the central portion of the dispersion head 703. The outlet 703b includes a plurality of holes 703c, through which the gas is supplied into the chamber toward the work piece. The dispersion head 703 also acts as a means for guiding a gas diffused by the first and second (or n-th) diffusers to the work piece onto which the gas is to be supplied. In other words, the dispersion head 703 induces the gas to be supplied toward the workpiece. Here, the work piece is the substrate (W) placed in the chamber.

Thus, at the component level, the gas supply apparatus includes the dispersion head and at least the first and second diffusers. As described above, additional diffusers may be added in the dispersion head as part of the gas supply apparatus. At the apparatus level, the processing apparatus includes the gas supply apparatus as just described, together with a chamber (plasma reaction chamber) and the pedestal for supporting the wafer within the chamber.

Figure 8:
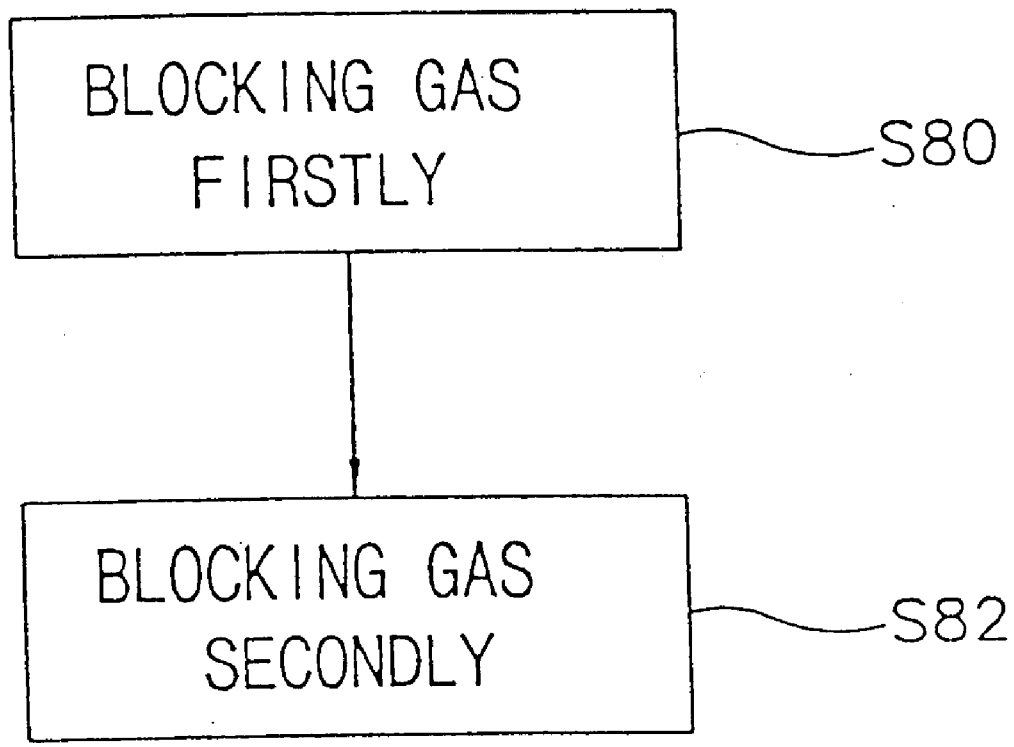
FIG. 8 is a flow chart illustrating a gas supply method in accordance with a preferred embodiment of the present invention.

FIG. 8 is a process flow chart illustrating a method for supplying a gas to a work piece. Referring to FIG. 8, in general, a gas is introduced through the inlet of the dispersion head and is then diffused by the first and second diffusers. Thereafter, the diffused gas is discharged through the outlet of the dispersion head and enters the chamber.

More specifically, after the gas is introduced through the inlet of the dispersion head, it is blocked and dispersed by the first diffuser (step S80), which is disposed at the upper central portion of the dispersion head. As a result, the blocked gas is diffused along side directions different that the original gas supply direction. Thereafter, the diffused gas moves to the lower portion of the dispersion head. At this time, the dispersion head guides a portion of the gas diffused by the first diffuser onto the substrate placed in the chamber.

Thereafter, the remaining diffused gas is blocked a second time by the second diffuser (step S82), which is positioned below the first diffuser, and which occupies a peripheral portion of the dispersion head, radially outward of the first diffuser. As a result, the secondly blocked gas is diffused again along side directions different than the original gas supply direction. At this time, the dispersion head guides the gas diffused by the second diffuser onto the substrate placed in the chamber.

If additional diffusers are arranged in the dispersion head, a portion of the twice diffused gas may be further blocked by the n-th diffuser, where n is greater than 2 in this case, since two diffusers were already disposed in the dispersion head.

As a result, the gas continues to be diffused along side directions different than the original gas supply direction.

Thus, the supplied gas is diffused throughout the entire portion of the dispersion head, including the central portion and the peripheral portion of the dispersion head. Thereafter, the diffused gas is supplied through the outlet of the dispersion head to the chamber. As a result, the supplied gas is uniformly supplied onto the substrate placed in the chamber, which makes it possible to form a uniform film or pattern on the substrate.

Figure 9:
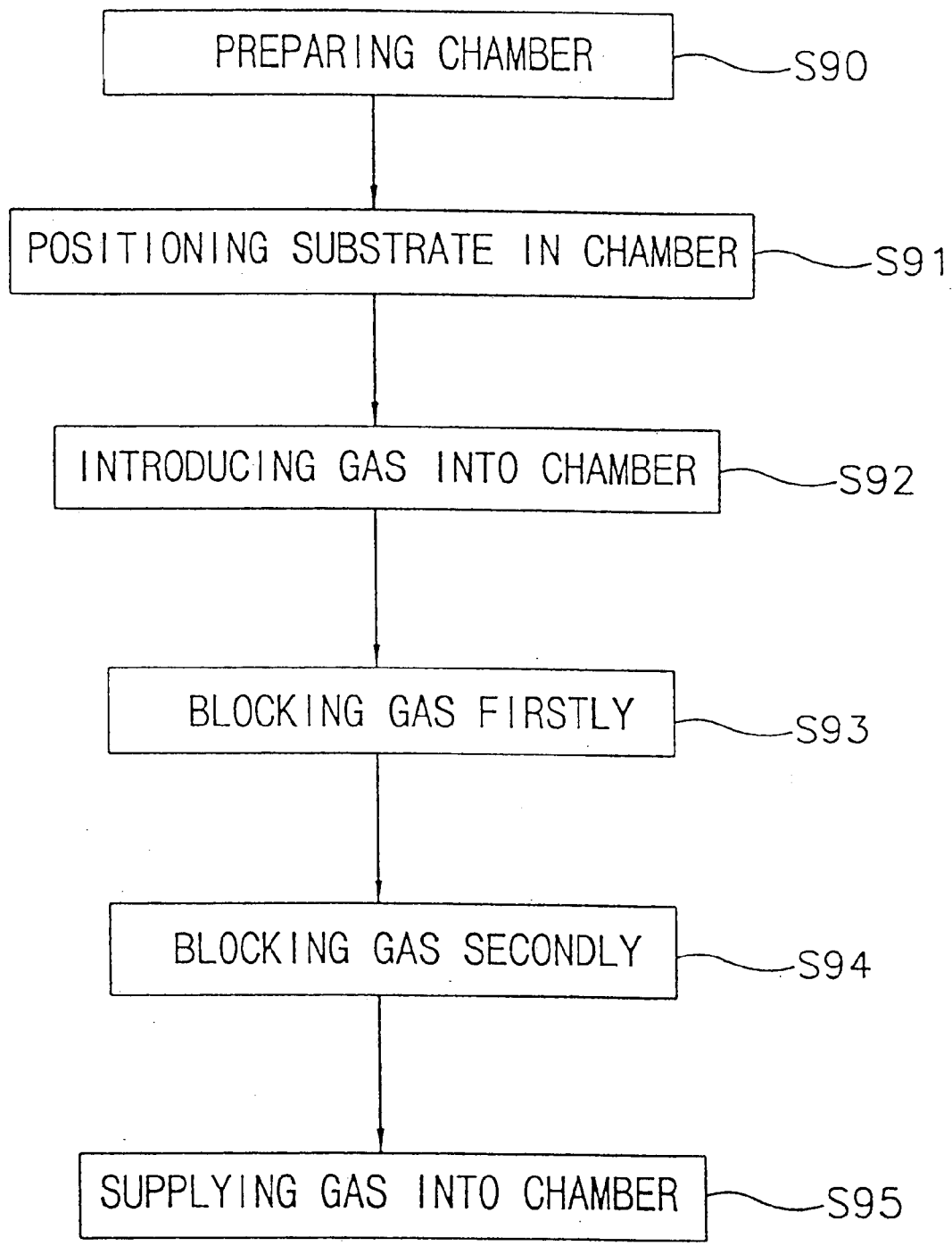
FIG. 9 is a flow chart illustrating a gas supply method into a chamber in accordance with another preferred embodiment of the present invention.

FIG. 9 is a process flow chart illustrating a method for supplying a process gas into the chamber. Referring to FIG. 9, a chamber is prepared (step S90). The chamber is provided with the gas supply apparatus including the first and second diffusers. The dispersion head has an inlet and an outlet. The inlet is arranged at the central portion of the dispersion head and the outlet is arranged at the peripheral portion of the dispersion head. The outlet includes a plurality of holes through which the diffused gas flows. The first diffuser is arranged at the upper portion of the dispersion head and occupies the central portion of the dispersion head. The second diffuser is disposed below the first diffuser at the lower portion of the dispersion head and occupies the peripheral portion of the dispersion head. The chamber also includes a pedestal on which a substrate is mounted. The chamber further includes a processing apparatus for forming a film or a pattern using a plasma reaction.

The substrate is introduced into the chamber and is positioned or mounted on the pedestal of the chamber (step S91), with the pedestal being arranged in the lower portion of the chamber. The substrate therefore confronts the dispersion head.

A gas is supplied into the chamber through the inlet of the dispersion head (step S92). The supplied gas is first blocked by the first diffuser (step S93). As a result, the blocked gas is diffused along side directions different than the gas supply direction, thereby dispersing the gas to portions of the dispersion head adjacent to the central portion.

The supplied gas is then blocked a second time by the second diffuser (step S94). As a result, the second blocked gas is diffused along side directions different than the gas supply direction, thereby dispersing the gas to peripheral portions of the dispersion head.

Thereafter, the gas diffused by the first and second diffusers is guided through the outlet and toward the substrate mounted on the pedestal in the chamber (step S95).

The gas supplied into the chamber has a uniform distribution, because the gas is diffused into the central portion and the peripheral portion of the dispersion head by the first and second diffusers. The uniform distribution of the supplied gas allows a film or a pattern to be uniformly formed with a constant thickness on the substrate.

Alternatively, the second diffused gas may be further blocked by an additional n-th diffuser, wherein n represents a natural number greater than 2. As a result, the gas continues to be diffused along the side directions different than the gas supply direction and is thus uniformly supplied into the chamber.

Figure 10:
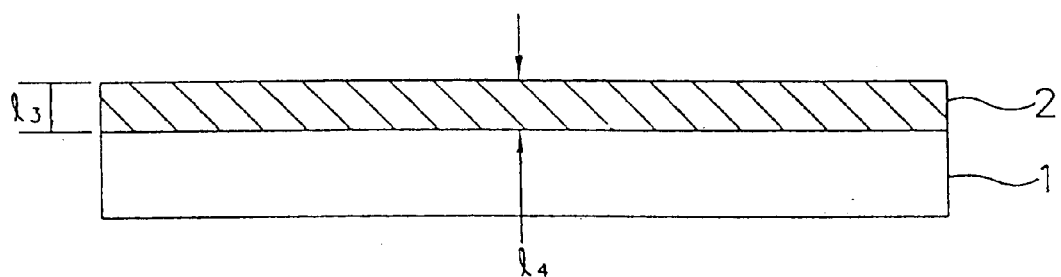
FIG. 10 is a simplified sectional view showing a state of a film formed on a substrate using the apparatus of FIG. 4.
Figure 11:
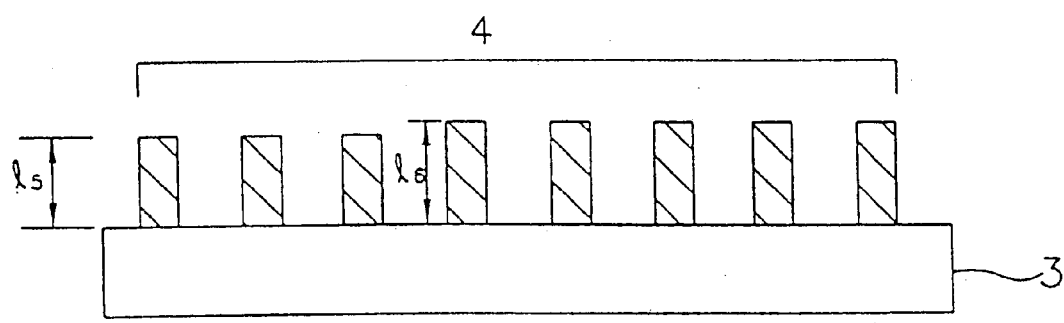
FIG. 11 is a simplified sectional view showing a state of a pattern formed on a substrate using the apparatus of FIG. 4.

FIG. 10 is a sectional view showing a state of a film formed using the processing apparatus of FIG. 4, and FIG. 11 is a sectional view showing a state of a pattern formed using the processing apparatus of FIG. 4.

Referring to FIG. 10, if $l_4$ is the thickness of the film 2 formed at the central portion of the substrate 1, and $l_3$ is the thickness of the film 2 formed at the edge portion of the substrate 1, then $l_3=l_4$. This is because, as described above, a process gas for forming the film is uniformly supplied onto the substrate 1 by diffusing the process gas using the first and second diffusers.

Referring to FIG. 11, if $l_6$ is the thickness of the pattern 4 formed at the central portion of the substrate 3, and $l_5$ is the thickness of the pattern 4 formed at the edge portion of the substrate 3, then $l_5=l_6$. This is because, as described above, a process gas for forming the film is uniformly supplied onto the substrate 3 by diffusing the process gas using the first and second diffusers.

Thus, since the gas supplying apparatus having at least two diffusers continues to diffuse the supplied gas, the gas can be uniformly supplied. The present invention allows a process gas introduced into the chamber to be uniformly supplied, thereby achieving a film or a pattern having a more uniform thickness. For present day semiconductor technologies requiring ultra fine and sophisticated processing techniques, it is indispensable to form such a film or a pattern having the uniform thickness to enhance reliability and productivity.

While the present invention has been shown and described with reference to particular embodiments thereof, it will be understood by those skilled in the art that various changes in form and details may be effected therein without departing from the spirit and scope of the invention as defined by the appended claims.

What is claimed is:

1. A method for supplying a gas used in a semiconductor process, comprising:

flowing a gas in a flow direction toward a first diffuser arranged in a dispersion head;

diffusing the gas a first time within the dispersion head by dispersing the gas along side directions different than the flow direction by contacting the gas and the first diffuser;

guiding a portion of the first diffused gas through an outlet of the dispersion head and toward a work piece arranged in a chamber;

diffusing a remaining portion of the first diffused gas a second time by contacting the gas and a second diffuser disposed between the first diffuser and the work piece, by dispersing the gas along side directions different than the flow direction; and guiding a portion of the second diffused gas through the outlet of the dispersion head and toward the work piece arranged in the chamber.

2. The method as claimed in claim 1, further comprising, diffusing a remaining portion of the (n−1)-th diffused gas an n-th time by contacting the gas and an n-th diffuser disposed between the (n−1)-th diffuser and the work piece, by dispersing the gas along side directions different than the flow direction; and guiding a portion of the n-th diffused gas through the outlet of the dispersion head and toward the work piece arranged in the chamber, wherein n is a natural number greater than 2.

3. The method as claimed in claim 2, wherein the diffusing of the gas the first time occurs in a first proximity at an upper central portion of the dispersion head, and the diffusing of the gas the second time occurs in a second proximity radially outward of, and below, the first proximity.

4. The method as claimed in claim 3, wherein the diffusing of the gas the n-th time occurs in an n-th proximity radially outward of, and below, the (n−1)-th proximity.

5. The method as claimed in claim 1, wherein the chamber is a plasma reaction chamber, and wherein the guiding steps form a film on the work piece using a plasma reaction.

6. The method as claimed in claim 1, wherein the chamber is a plasma reaction chamber, and wherein the guiding steps etch a film formed on the work piece using a plasma reaction.

* * * * *